United States Patent [19]

Muro et al.

[11] Patent Number: 5,828,377
[45] Date of Patent: Oct. 27, 1998

[54] SHAPE DEPENDENT THREE-DIMENSIONAL GRAPHIC DATA MANAGING METHOD

[75] Inventors: Keiro Muro, Kokubunji; Kazuaki Iwamura, Kodaira, both of Japan

[73] Assignee: Hitachi, Ltd., Tokyo, Japan

[21] Appl. No.: 559,993

[22] Filed: Nov. 17, 1995

[30] Foreign Application Priority Data

Nov. 21, 1994 [JP] Japan .................................. 6-311211

[51] Int. Cl.$^6$ .............................................. G06T 17/00
[52] U.S. Cl. ........................................................ 345/420
[58] Field of Search ...................... 395/119, 120, 395/123, 124

[56] References Cited

U.S. PATENT DOCUMENTS 5,379,371  1/1995  Usami et al. ...................... 395/120 X
5,404,428  4/1995  Wu .................................... 395/120 X

FOREIGN PATENT DOCUMENTS 4-149681  5/1992  Japan .

*Primary Examiner*—Heather R. Herndon
*Assistant Examiner*—Cliff N. Vo
*Attorney, Agent, or Firm*—Antonelli, Terry, Stout, & Kraus, LLP

[57] ABSTRACT

An integrated data structure is provided which can be maintained and managed by selectively using data storage forms for storing graphic data representing three-dimensional figures, such as houses, roads, underground piping and the like, according to the properties of an object figure and mixing the same. Three control flags respectively specifying three kinds of operations for extension to be carried out for extending two-dimensional graphic data comprising two-dimensional coordinates (x, y) can be selectively used. An extension 1 to specify the component points of a figure by coordinates (x, y, z), an extension 2 to specify a z-coordinate indicating the altitude of a figure for the figure, and an extension 2 to specify a value d and information f indicating the construction of a figure having a predetermined shape and a method of display are used individually or in combination to form a three-dimensional figure. A variety of three-dimensional figures can be formed by using a comparatively small amount of graphic data, requiring a storage apparatus having a comparatively small storage capacity.

9 Claims, 17 Drawing Sheets

FIG. 1

| | | FIRST COLUMN | 2ND COLUMN | 3RD COLUMN |
|---|---|---|---|---|
| | | BASIC FORM | (f, d) EXTENSION  d = HEIGHT | (f, d) EXTENSION  d = WIDTH etc. |
| zΣ (x, y) EXTENSION | POINT | 101 | 107  f = POLYANGULAR COLUMN | 112  f = CIRCLE    f = SPHERE |
| | LINE | 102 | 108  f = POLYANGULAR COLUMN | 113  f = BAND    f = TUBE |
| | PLANE | 103 | 109  f = POLYANGULAR COLUMN | 114  f = POLYANGULAR PYRAMID |
| Σ (x, y, z) EXTENSION | POINT | 104 | 110  f = POLYANGULAR COLUMN | 115  f = CIRCLE    f = SPHERE |
| | LINE | 105 | — | 116  f = BAND    f = TUBE |
| | PLANE | 106 | 111  f = POLYANGULAR COLUMN | 117  f = POLYANGULAR PYRAMID |

FIG. 3
| | TWO-DIMENSIONAL FIGURE | $\Sigma$ (x, y, z) EXTENSION | $z\Sigma$ (x, y) EXTENSION |
|---|---|---|---|
| POINT | 301  | 304 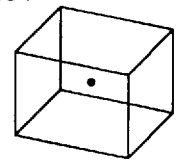 | 307  |
| LINE | 302 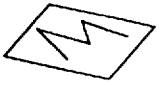 | 305 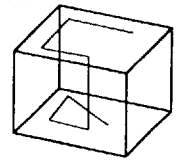 | 308  |
| PLANE | 303  | 306 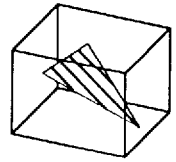 | 309  |

| COMPONENT POINT EXTENSION | OFF |
|---|---|
| $\Sigma$ (x, y, z) EXTENSION | OFF |
| z$\Sigma$ (x, y) EXTENSION | OFF |
| (f, d) EXTENSION | OFF |
| NUMBER OF COMPONENT POINTS DIMENSIONAL FLAG ATTRIBUTE INFORMATION | |
| X1 Y1 | |
| X2 Y2 | |
| ⋮ | |

FIG. 8

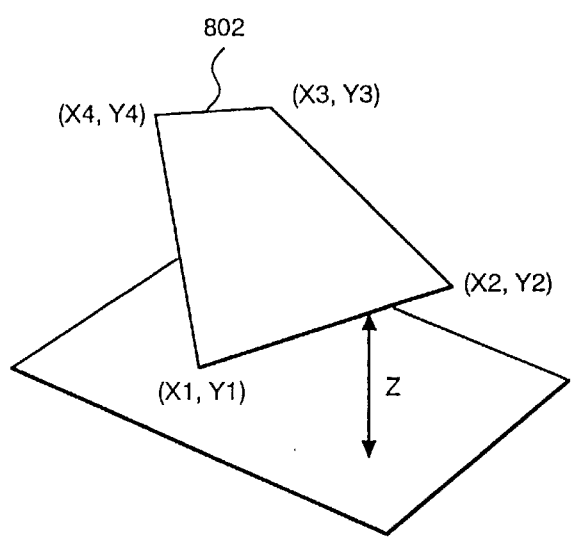

```
                            ┌─ 801
┌─────────────────────────────┐
│ COMPONENT POINT             │
│ EXTENSION            OFF    │
│ Σ (x, y, z) EXTENSION  OFF  │
│ zΣ (x, y) EXTENSION    ON   │
│ (f, d) EXTENSION       OFF  │
├─────────────────────────────┤
│ NUMBER OF COMPONENT POINTS  │
│    DIMENSIONAL FLAG         │
│   ATTRIBUTE INFORMATION     │
│             Z               │
├─────────────────────────────┤
│           X1                │
│           Y1                │
├─────────────────────────────┤
│           X2                │
│           Y2                │
├─────────────────────────────┤
│            •                │
│            •                │
│            •                │
└─────────────────────────────┘
```

| | |
|---|---|
| COMPONENT POINT EXTENSION | OFF |
| Σ (x, y, z) EXTENSION | OFF |
| zΣ (x, y) EXTENSION | OFF |
| (f, d) EXTENSION | ON |
| NUMBER OF COMPONENT POINTS | |
| DIMENSIONAL FLAG | |
| ATTRIBUTE INFORMATION | |
| MEANING f : POLYANGULAR COLUMN | |
| HEIGHT d | |
| X1 Y1 | |
| X2 Y2 | |
| ⋮ | |

901

| COMPONENT POINT EXTENSION | ON |
|---|---|
| Σ (x, y, z) EXTENSION | OFF |
| zΣ (x, y) EXTENSION | OFF |
| (f, d) EXTENSION | OFF |

NUMBER OF COMPONENT POINTS
DIMENSIONAL FLAG
ATTRIBUTE INFORMATION

| Σ (x, y, z) EXTENSION | OFF |
|---|---|
| (f, d) EXTENSION | OFF |
| X1 | |
| Y1 | |
| Σ (x, y, z) EXTENSION | OFF |
| (f, d) EXTENSION | OFF |
| X2 | |
| Y2 | |
| Σ (x, y, z) EXTENSION | ON |
| (f, d) EXTENSION | OFF |
| X3 | |
| Y3 | |
| Z3 | |
| Σ (x, y, z) EXTENSION | OFF |
| (f, d) EXTENSION | OFF |
| X4 | |
| Y4 | |

| | |
|---|---|
| COMPONENT POINT EXTENSION | ON |
| Σ (x, y, z) EXTENSION | OFF |
| zΣ (x, y) EXTENSION | OFF |
| (f, d) EXTENSION | ON |
| NUMBER OF COMPONENT POINTS DIMENSIONAL FLAG ATTRIBUTE INFORMATION MEANING f : BAND WIDTH d | |
| Σ (x, y, z) EXTENSION | OFF |
| (f, d) EXTENSION | OFF |
| X1 Y1 | |
| Σ (x, y, z) EXTENSION | OFF |
| (f, d) EXTENSION | OFF |
| X2 Y2 | |
| Σ (x, y, z) EXTENSION | OFF |
| (f, d) EXTENSION | ON |
| X3 Y3 MEANING f : BAND WIDTH d3 | |
| Σ (x, y, z) EXTENSION | OFF |
| (f, d) EXTENSION | OFF |
| X4 Y4 | |
| • • • | |

1201

SHAPE DEPENDENT THREE-DIMENSIONAL GRAPHIC DATA MANAGING METHOD

BACKGROUND OF THE INVENTION

The present invention relates to a three-dimensional graphic data managing method to be carried out by a graphic data processing system, such as a geographic information system (GIS) or a computer-aided design system (CAD system) and, more specifically, to a graphic data managing method capable of managing graphic data including those representing three-dimensional figures.

Geographic information systems that deal with electronic geographic information instead of paper maps have been developed and have been applied principally to retrieving two-dimensional map data and attributes. The stratification of urban structures on the ground and under the ground, such as the stratified arrangement of underground shopping complex, graded roads, underground railways, water supply pipe systems, sewage pipe systems, electric power distribution systems and gas supply pipe systems, has been promoted by the progressive complication of urban functions. The management of three-dimensional data having an advanced expressive ability has become necessary to enable the geographic information system to perform advanced management and utilization of geographic information.

FIG. 15 shows a conventional two-dimensional graphic representation system. A closed area 1501 has the following hierarchical structure.

(1) The closed area 1501 is defined by points A, B, C and D.

(2) The position of the point A is specified by coordinates (XA, YA), and the respective positions of the points B, C and D are specified likewise.

Actual data comprises header information including attribute information specifying the attribute of the figure and information about the number of the component points of the figure, i.e., points defining the figure, and the coordinates (x, y) of the component points (Table 1503). The attribute information specifies, for example, the colors of polygonal lines, the types of the polygonal line, such as solid line, broken line or the like, and the thickness of the polygonal lines. Reference is made to a control flag included in the header information to see whether the figure is a closed area, such as the closed area 1501, or whether the same is a broken line, such as an open broken line 1502 to discriminate between a close area and an open broken line.

Three-dimensional graphic representation systems have been developed for application principally to the CAD field. FIG. 16 shows a programmers hierarchical interactive graphic standard system (PHIGS system), i.e., a typical three-dimensional graphic representation system for a CAD system. A solid figure 1601 has the following hierarchical structure.

(1) The solid figure 1601 is defined by planes ABCD, ABFE, BCGF, CDHG, DAEH and EFGH.

(2) The plane ABCD is defined by points A, B, C and D. The other planes ABFE, BCGF, CDHG, DAEH and EFGH are defined likewise.

(3) The position of the point A is specified by coordinates (XA, YA, ZA). The respective positions of the other points B, C, D, E, F, G and H are specified likewise.

The conventional CAD system manages a solid figure on a principle that a solid figure has a hierarchical structure comprising a plurality of planes and plurality of points defining each plane. Actual data on a solid figure comprises header information indicating the constitution of a figure, and coordinates (x, y, z) specifying the position of each component point of each plane (Table 1602).

A simple three-dimensional graphic data producing system disclosed in Japanese Patent Laid-open No. 4-149681 limits solid figures to those having their bottom planes in an X-Y plane to reduce the amount of data to be handled. FIG. 17 shows this simple three-dimensional graphic representation system, which represents a solid figure 1701 by the following hierarchical structure.

(1) The solid figure 1701 is a polyangular column having a bottom plane ABCD.

(2) The bottom plane ABCD is defined by points A, B, C and D.

(3) The position of the point A is specified by coordinates (XA, YA). The respective positions of the other points B, C and D are specified likewise.

(4) The solid figure 1701 has a height h.

This simple three-dimensional graphic representation system manages a solid figure on the basis of a principle that a polyangular column can be defined by the shape of the bottom plane and the height. Actual data comprises header information indicating the attribute of the figure, the height h of the polyangular column, and coordinates (x, y) specifying the position of each component point of the bottom plane (Table 1702).

SUMMARY OF THE INVENTION

Although the PHIGS system previously described with reference to FIG. 16 is capable of expressing all kinds of three-dimensional figures, the PHIGS system needs to handle redundant data including a plurality of sets of coordinates specifying the position of each component point and included in data on a plurality of planes and needs a large amount of data for expressing a three-dimensional figures. The three-dimensional graphic representation system disclosed in Japanese Patent Laid-open No. 4-149681 previously described with reference to FIG. 17 saves data. However, this system is capable of expressing only polyangular columns and incapable of expressing general solid figures.

Since the geographic information system needs to deal with a large amount of a variety of graphic data, the reduction of the amount of necessary data is the most important problem in view of reducing the necessary capacity of the graphic data storage unit of the geographic information system. On the other hand, in some cases, detailed representation of ground structures is necessary as geographic information. Therefore, both the data must be expressed in the same data structure. In view of using the geographic information, the geographic information system must be capable of expressing geographic information in conventional two-dimensional maps and of readily converting three-dimensional graphic data into two-dimensional graphic data.

The present invention has been made in view of the foregoing problems and it is therefore an object of the present invention to provide a three-dimensional graphic data managing method requiring a comparatively small amount of data, and capable of expressing figures in detail using a comparatively small amount of data and of readily expressing two-dimensional figures as well as three-dimensional figures.

A conventional two-dimensional graphic data managing method that handles sets of coordinates specifying the component points of a figure, such as the two-dimensional graphic representation system previously described with reference to FIG. 15, is employed as a basic method when handling three-dimensional graphic data, so that operations for the extension of three data structures shown below are performed individually or simultaneously for each figure. More concretely, three-dimensional graphic data is formed of header information and component point information, wherein the header information includes attribute information specifying a height, a shape, a color or the like common to the entire figure, the component point information includes sets of coordinates specifying the respective positions of the component points, and a control flag is provided in the header information so that storage areas for storing extension information about predetermined extending operations to be carried out for all the component points are added to the header information or the component point information when the control flag is in the ON state. The three data structures are as follows.

(1) Operation for $\Sigma(x, y, z)$ extension: Set of coordinates (x, y, z) is used instead of a set of coordinates (x, y) for management.

(2) Operation for $z\Sigma(x, y)$ extension: One z-coordinate is added to the header information about each figure. The z-coordinate represents the altitude of the figure.

(3) Operation for (f, d) extension: Meaning information f representing shape and a parameter d are added to the header information.

These extending operations may be performed for all the component points of a figure or may be performed each of the component point. Graphic data including extended graphic data is managed.

According to the present invention, the $\Sigma(x, y, z)$ extension is applied to points, lines and planes, i.e., two-dimensional figures, to express points in a space, three-dimensional broken lines and oblique planes (FIG. 3), and the $z\Sigma(x, y)$ extension is applied to points, broken lines and planes to express points, broken lines and planes on the same level. When the (f, d) extension is applied to those figures, various figures, such as polyangular columns, polyangular pyramids, circles, spheres, bands and tubes, can be expressed (FIG. 1).

The mixed management of data structures realizes a three-dimensional graphic data managing method requiring a comparatively small amount of data and capable of necessary details of figures. Since two-dimensional figures are used as basic forms, the data structure is similar to that used by the conventional methods and the data structure can be applied to representing two-dimensional figures as well as three-dimensional figures.

Further advantages of the present invention will become apparent to those with ordinary skill in the art upon reading and understanding the following detailed description of the preferred and alternate embodiments.

BRIEF DESCRIPTION OF THE DRAWINGS

The invention will be described in conjunction with certain drawings which are for the purpose of illustrating the preferred embodiment of the invention and its modifications only, and not for the purpose of limiting the same, and wherein:

FIG. 1 is a classification diagram showing three-dimensional structures that can be expressed by the present invention;

FIG. 3 is a classification diagram showing three-dimensional structures that can be expressed by the present invention;

FIG. 8 is a diagrammatic view of a representation of a two-dimensional figure having an altitude;

DETAILED DESCRIPTION OF THE PREFERRED EMBODIMENTS

Figure 2:
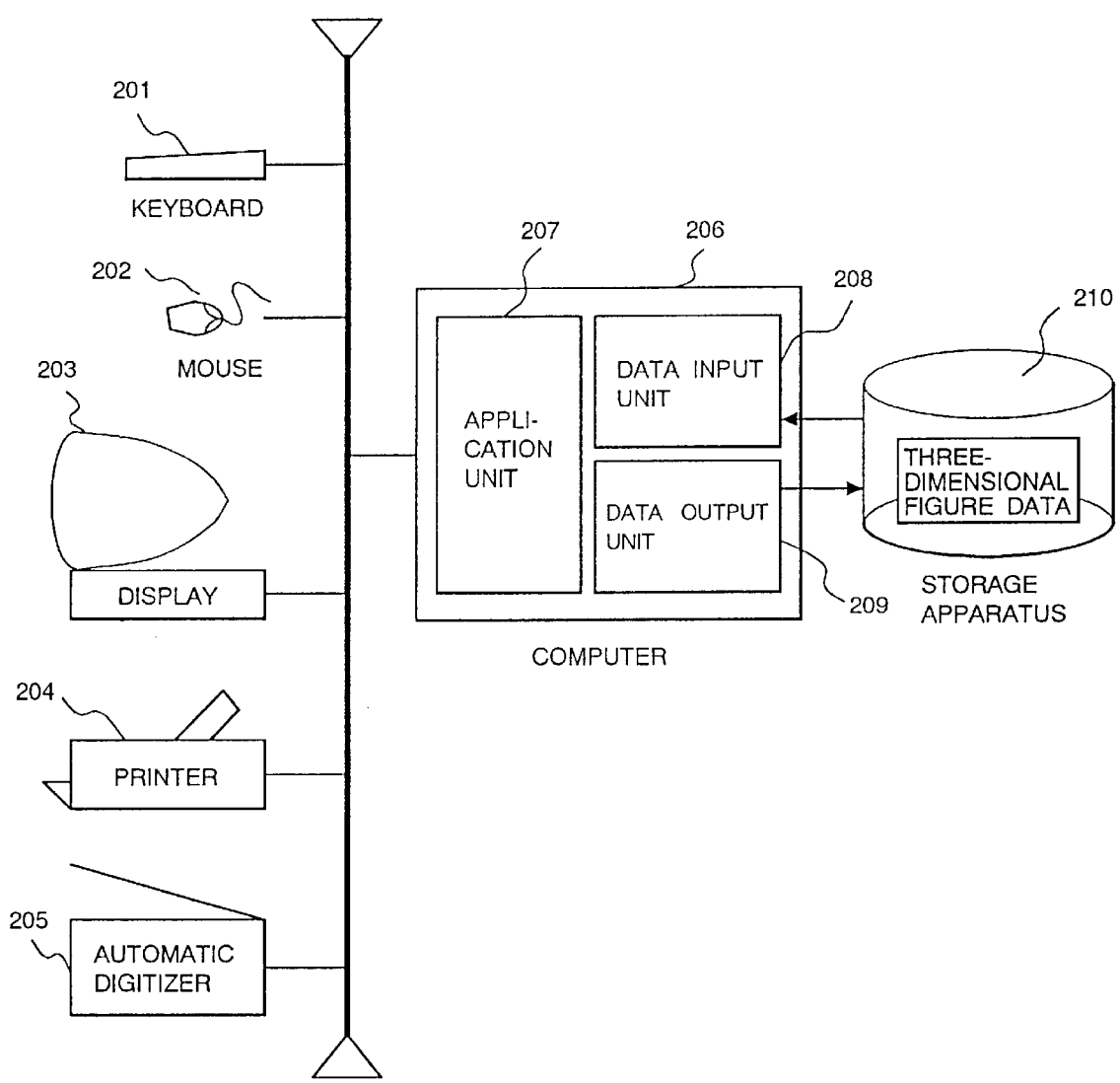
FIG. 2 is a block diagram of a three-dimensional graphic data management system.

Referring to FIG. 2 showing a three-dimensional graphic data management system for carrying out a three-dimensional graphic data managing method in a preferred embodiment according to the present invention, there are shown an interfacing means for retrieving and editing graphic data, including a keyboard 201 and a mouse 202, a display 203 for graphic display, a printer 204 for providing hard copies of figures, an automatic digitizer 205 for reading figures, such as components of a map, and converting the graphic data obtained by reading into digital graphic data, and a storage apparatus 210 provided with hard disks or the like for storing the digital graphic data. The three-dimensional graphic data managing system is provided with a computer 206, such as a work station or a personal computer, that executes the three-dimensional graphic data managing method. The computer 206 comprises an application unit 207 for displaying figures, retrieving the attribute of a figure, editing a figure and such like, a data input unit 208 for receiving graphic data from the storage apparatus 210, and a data output unit 209 for giving graphic data to the storage apparatus 210. Basic figures to be handled by the three-dimensional graphic data managing method of the present invention are two-dimensional figures, such as two-dimensional figures 301, 302 and 303 shown in FIG. 3. Graphic data on the two-dimensional figures 301, 302 and 303 has the following data structure.

(1) Header information (One piece): Number of component parts, dimension flag and attribute information (2) Component point information (N pieces): Coordinates (x, y).

The number of component points indicates the number of component points defining the figure. For example, a triangle is defined by three component points, and a quadrangle is defined by four component points. The dimension flag specifies the number of dimensions of the figure to identify the point 301, the line 302 or the plane 303. The attribute information includes attribute data on the type and color of the line, a hatching pattern, linkage with other data and the like. The number of data included in the component point information is equal to the number of the component points. The data included in the component point information are sets of coordinates (x, y) specifying the positions of the component points. The three-dimensional graphic data managing system subjects those two-dimensional graphic data of the aforesaid data structure to three kinds of data structure extending operations to express three-dimensional figures. One, two or all the three kinds of data structure extending operations may be applied to extending the graphic data of each of the two-dimensional figures.

(1) Operation for $\Sigma(x, y, z)$ extension: Specification of the position of the component point by a set of coordinates (x, y, z) instead of (x, y)

(2) Operation for $z\Sigma(x, y)$ extension: Addition of a z-coordinate indicating the altitude of the position of a figure to the header information about the figure (3) Operation for (f, d) extension: Addition of meaning information f and parameter d indicating the shape of a figure.

These three kinds of two-dimensional graphic data extending operations will be described in detail hereinafter.

1. Operation for $\Sigma(x, y, z)$ Extension

The positions of the component points of a two-dimensional figure are specified by sets of coordinates (x, y). Graphic data on the figure is subjected to the $\Sigma(x, y, z)$ extension to specify the component points of the figure by sets of coordinates (x, y, z). For example in FIG. 3, when the point 301, the line 302 and the plane 303, i.e., two-dimensional figures are subjected to the $\Sigma(x, y, z)$ extension, a point 304 at an optional position in a space, a three-dimensional broken line 305 having oblique sections and bent sections, and an oblique plane 306 can be expressed, respectively. A solid body can be expressed by a combination of inclined planes like the oblique plane 306. In an actual geographic representation, the broken line 305 is used for expressing an underground piping, such as sewage piping, and the oblique plane 306 is used for expressing a slope of a mountain and the roof of a house. Only one of the component points of a figure specified by sets of coordinates (x, y) may be subjected to the $\Sigma(x, y, z)$ extension to specify only this point by a set of coordinates (x, y, z). In this embodiment, such a data structure is interpreted as "the respective z-coordinates of the component points other than the component point specified by a set of coordinates (x, y, z) are equal to the z-coordinate of the component point specified by the set of coordinates (x, y, z)", which will be described in detail later. This interpretation contributes to the reduction of the amount of data when the z-coordinates of a series of component points succeeding the component point specified by the set of coordinates (x, y, z) are equal to the z-coordinate of the component point specified by the set of coordinates (x, y, z). In a practical application of the $\Sigma(x, y, z)$ extension to expressing a piping system represented by a three-dimensional figure for a multistoried building, since each of piping divisions of the piping system for each story can be represented, in most cases, by a two-dimensional figure, the amount of data necessary for expressing the piping system can be reduced by subjecting the component points defining piping divisions to the $\Sigma(x, y, z)$ extension.

2. Operation for $z\Sigma(x, y)$ Extension

The $z\Sigma(x, y)$ extension adds the same z-coordinate to sets of coordinates specifying all the component points of a figure. The z-coordinate specifies the altitude, i.e., the height above a given datum, such as the average sea level or the ground level, of the figure. Actual geographic data includes many graphic data representing two-dimensional figures, such as roads, vacant lots and the like. If the $\Sigma(x, y, z)$ extension is applied to the graphic data to specify the position of each component point by a set of coordinates (x, y, z), the same z-coordinate must be stored for all the component points, which requires redundant expression. Therefore, the $z\Sigma(x, y)$ extension is applied to the graphic data to specify the position of each component point by a set of coordinates (x, y) and the z-coordinate is assigned to the entire figure. As shown in FIG. 3, when the graphic data on the point 301, the line 302 and the plane 303 are subjected to the $z\Sigma(x, y)$ extension, the point 301, the line 302 and the plane 303 are changed to a point 307, a line 308 and a plane 309 at an altitude, respectively. In an application to managing actual geographic data, the $z\Sigma(x, y)$ extension is used for expressing horizontal figures parallel to the ground surface, such as contour lines. When the $z\Sigma(x, y)$ extension is applied to the entire figure, the altitude of the figure can be specified.

3. Operation for (f, d) Extension

The figure of a tube can be expressed when a broken line representing the center line of the tube and the diameter of the tube are given. Similarly, the figure of a band, such as a road, can be expressed when a broken line representing the center line of the band and the width of the band are given, the figure of a circle or a sphere can be expressed when coordinates specifying the center of the circle or the sphere and the radius of the circle or the sphere are given, the figure of a polyangular column, such as a triangular column or a square column, can be expressed when the shape of the bottom surface and the height of the polyangular column, and the figure of a polyangular pyramid, such as a triangular pyramid or a square pyramid, can be expressed when the shape of the bottom surface and coordinates (x, y, z) specifying the position of the vertex are given.

The (f, d) extension adds meaning information f specifying the construction of a figure, and a parameter d necessary for specifying the construction of the figure to the header information to express a variation of the figure. The meaning information indicates the general shape of the figure, such as a circle, a sphere, a polyangular column, a polyangular pyramid, a tube or a band. The method of application of the parameter d is dependent on the selected meaning information f. The parameter d is used by a shape generating means specified by the meaning information f. A plurality of parameters d may be specified and the number of the parameters d is dependent on the meaning information f. Concretely, the shape generating means is a program for generating a shape determined by the meaning information f. The program uses the parameter or parameters d.

Referring to FIG. 1 showing examples of figures obtained by the (f, d) extension, points, lines and planes, i.e., basic figures 101 to 106, obtained by subjecting a point, a line and a plane to the $z\Sigma(x, y)$ extension or the $\Sigma(x, y, z)$ extension are arranged in the first column. figures 107 to 111 obtained by subjecting the basic figures 101 to 106 to the (f, d)

extension, in which the meaning information f specifies a polyangular column, are arranged in the second column. figures 112 to 117 obtained by subjecting the basic figures 101 to 106 arranged in the first column to the (f, d) extension, in which the meaning information f specifies a circle, a sphere, a band, a tube or a polyangular pyramid, are arranged in the third column.

The figures in the second column will be described. When the meaning information f specifies a polyangular column and the parameter d specifies the height, the figures 107 and 110 having the shape of a pole standing in a vertical position on the ground can be expressed by extending the graphic data of the figures 101 and 104 (points), respectively, and the figure 108 having the shape of a folding screen can be expressed by extending the graphic data of the figure 102 (line), and the figure 109 having the shape of a polyangular column having a bottom surface corresponding to the figure 103 can be expressed by extending the graphic data of the figure 103 (plane).

The figures in the third column will be described. When the meaning information f specifies a circle or a sphere and the parameter d specifies a radius, the figure 112 having the shape of a circle or a sphere can be expressed by extending the graphic data on the figure 101 (point), while the figure 115 having the shape of a circle or a sphere can be expressed by extending the graphic data on the figure 114. When the meaning information f specifies a band or a tube, and the parameter d specifies a radius, the figure 113 having the shape of a band or a tube can be expressed by extending the graphic data on the figure 102 (line) and the figure 116 having the shape of a band or a tube can be expressed by extending the graphic data of the figure 105 (line). When the meaning information f specifies a polyangular pyramid and the parameter d specifies the coordinates (x, y, z) of the vertex, the figure 114 having the shape of a polyangular pyramid can be expressed by extending the graphic data of the figure 103 (plane) and the figure 117 having the shape of a polyangular pyramid can be expressed by extending the graphic data of the figure 106 (plane).

Figure 4:
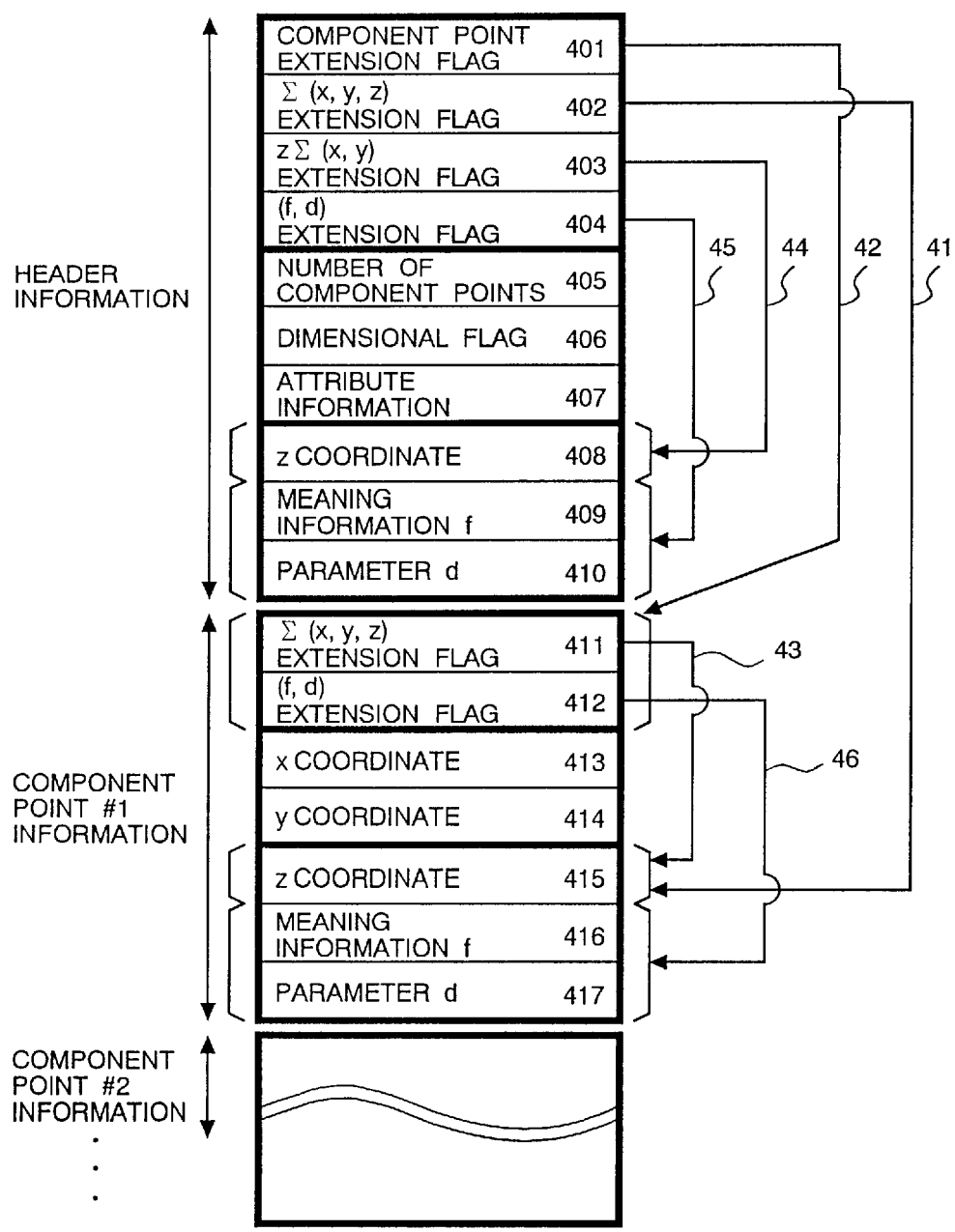
FIG. 4 is a diagrammatic view of assistance in explaining a three-dimensional graphic data table in accordance with the present invention.

FIG. 4 shows a data structure expressing a three-dimensional figure. This data structure has, similarly to the conventional data structure expressing a two-dimensional figure, header information and component point information. The number of pieces of the component point information is equal to that of component points. Each of the header information and the component point information comprises resident information and additional information added for extension. In FIG. 4, pieces of the additional information are bracketed, and flags specifying the additional information and the corresponding pieces of additional information are interconnected by arrows, respectively. These pieces of additional information are added for operations for extension. When executing the $\Sigma(x, y, z)$ extension for a certain figure, a $\Sigma(x, y, z)$ extension flag 402 included in the header information on the figure is set to the ON state, and then a z-coordinate 415 is added as extension information to all the pieces of the component point information on the figure as indicated by the arrow 41. When executing the $\Sigma(x, y, z)$ extension for each component point, a component point extension flag 401 included in the header information is set to the ON state. Then, flag information 411 and 412 is added to every component point information as indicated by the arrow 42. When the $\Sigma(x, y, z)$ extension flag 411 is set to the ON state, a z-coordinate 415 is added as extension information to the component point information as indicated by the arrow 43. When executing the $z\Sigma(x, y)$ extension, a $z\Sigma(x, y)$ extension flag 403 included in the header information is set to the ON state, and then a z-coordinate 408 is added as extension information to the header information as indicated by the arrow 44. When executing the (f, d) extension, a (f, d) extension flag 404 included in the header information is set to the ON state, and then meaning information f 409 and a parameter d 410 are added as extension information as indicated by the arrow 45. When executing the (f, d) extension for each component point, the component point extension flag 401 of the header information is set to the ON state to add flag information 411 and 412 to every component point information. When the (f, d) extension flag 412 is in the ON state, meaning information f 416 and a parameter d 417 are added as extension information to the component point information as indicated by the arrow 46.

In the three-dimensional graphic data managing system shown in FIG. 2, graphic data on a three-dimensional figure is read and stored in the storage apparatus 210 by using the keyboard 201, the mouse 202 and the automatic digitizer 205. Graphic data on a three-dimensional figure may be acquired by any suitable method. For example, an extension form for extending a three-dimensional figure, coordinates specifying the component points of the three-dimensional figure and parameters may be entered by the user. Information on the component points of a three-dimensional figure may be entered by displaying a figure represented by digital graphic data provided by the automatic digitizer 205 on the display 203 and specifying the component points on the picture of the three-dimensional figure displayed on the display 203. The input graphic data on the three-dimensional figure is stored in the storage apparatus 210 in the aforesaid data structure.

When the graphic data of a basic form on a three-dimensional figure is entered without specifying any extension form, the three-dimensional graphic data managing system selects an optimum extension form, and graphic data expressed in the selected extension form may be stored in the storage apparatus 210. Graphic data of the conventional data structure on a three-dimensional figure may be stored in the storage apparatus 210 after being converted into corresponding graphic data of the aforesaid data structure.

The graphic data on a three-dimensional figure stored in the storage apparatus 210 is transferred to the display 203 according to instructions given by the user to display the three-dimensional figure on the display 203. The three-dimensional graphic data managing system can be used for retrieving a three-dimensional figure by entering retrieval position coordinates to retrieve a three-dimensional figure having a component point specified by the coordinates.

Figure 5:
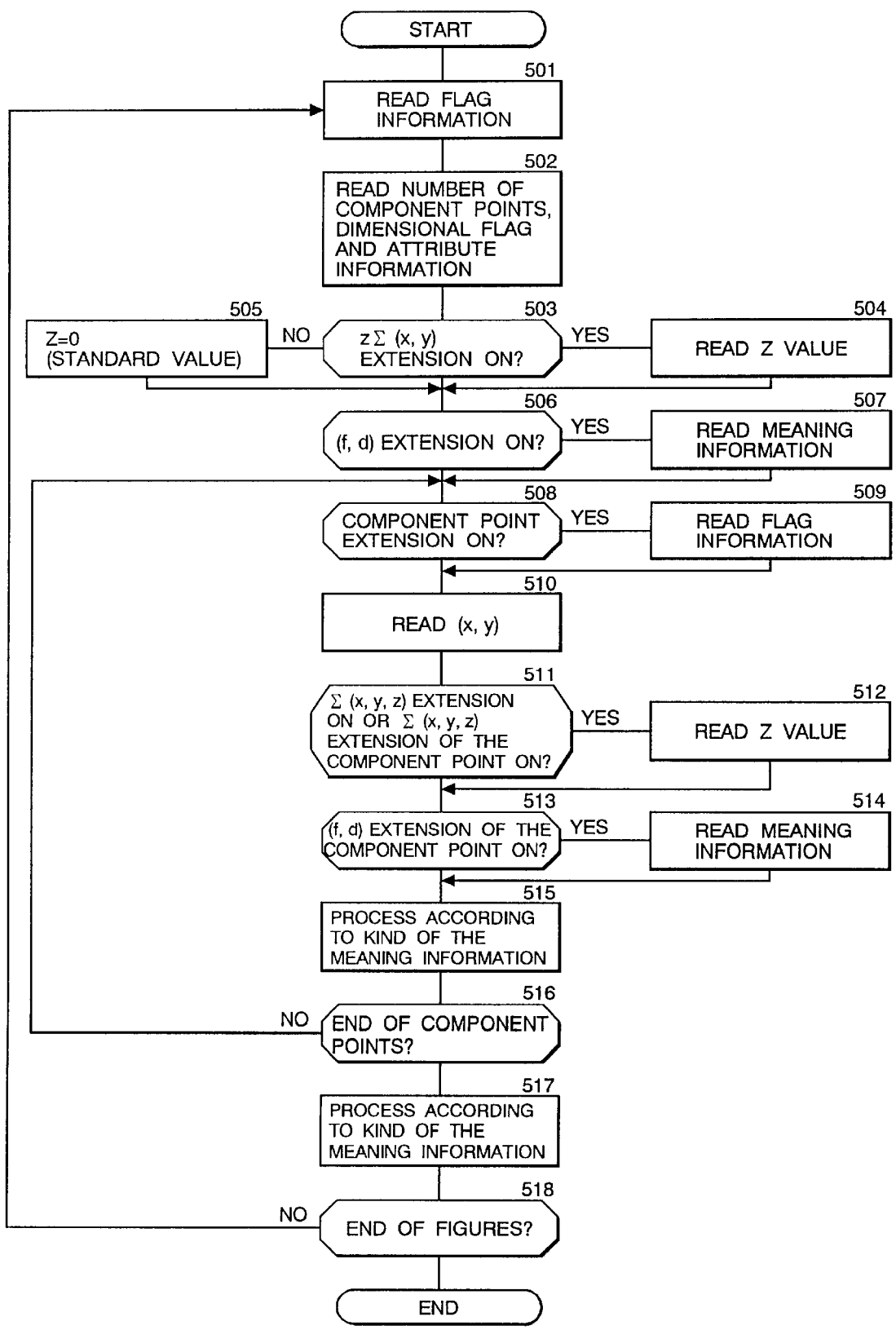
FIG. 5 is a flow chart of an algorithm for interpreting three-dimensional graphic data.

The three-dimensional graphic data managing system must be able to interpret the data structure to display or retrieve a three-dimensional figure represented by the graphic data of the aforesaid data structure. An algorithm for interpreting the data structure will be described hereinafter. FIG. 5 shows an algorithm for interpreting the data structure of graphic data representing a three-dimensional figure to display or retrieve the three-dimensional figure.

Process 1: Flag information, i.e., the component point extension flag 401, the $\Sigma(x, y, z)$ extension flag 402, the $z\Sigma(x, y)$ extension flag 403 and the (f, d) extension flag 404 is read from the header information (step 501).

Process 2: An attributes common to the extensions, i.e., the number 405 of the component points, the dimension flag 406 and the attribute information 407 are read from the header information (step 502).

Process 3: The z-coordinate 408 included in the header information is read if the $z\Sigma(x, y)$ extension flag is in the ON state or the z-coordinate is 0 or a predetermined reference value if the zΣ(x, y) extension flag is in the OFF state (steps 503, 504 and 505).

Process 4: The meaning information f 409 and the parameter d 410 included in the header information are read if the (f, d) extension flag 404 is in the ON state (steps 506 and 507).

Process 5: The flag information on the component point, i.e., the Σ(x, y, z) extension flag 411 for the component point and the (f, d) extension flag 412 for the component point are read if the component point extension flag 401 is in the ON state (steps 508 and 509).

Process 6: The x-coordinate 413 and the y-coordinate 414 are read (step 510).

Process 7: The z-coordinate is read if the Σ(x, y, z) extension flag 402 is in the ON state or the Σ(x, y, z) extension flag 411 for the component point is in the ON state (steps 511 and 512).

Process 8: The meaning information f 416 and the parameter d 417 are read if the (f, d) extension flag 412 for the component point is in the ON state (steps 513 and 514).

Process 9: A displaying operation or a retrieving operation is executed depending on the form of the (f, d) extension for the component point (step 515).

Process 10: Processes 5 through 9 are repeated for all the component points (step 516).

Process 11: A displaying operation or a retrieving operation is executed depending on the form of the (f, d) extension for the component point (step 517).

Process 12: Processes 1 through 11 are repeated for all the figures included in a three-dimensional figure table (step 518).

Concrete examples of figures and tables of data of the data structure described with reference to FIG. 4 will be shown and explained hereinafter.

Figure 6:
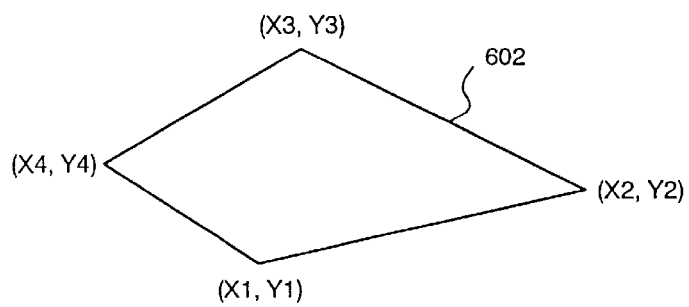
FIG. 6 is a diagrammatic view of a representation of a two-dimensional figure not having any altitude.

Referring to FIG. 6, graphic data on a two-dimensional figure 602 does not include any height information and all the extension flags are in the OFF state and hence the graphic data is expressed by a table 601.

Figure 7:
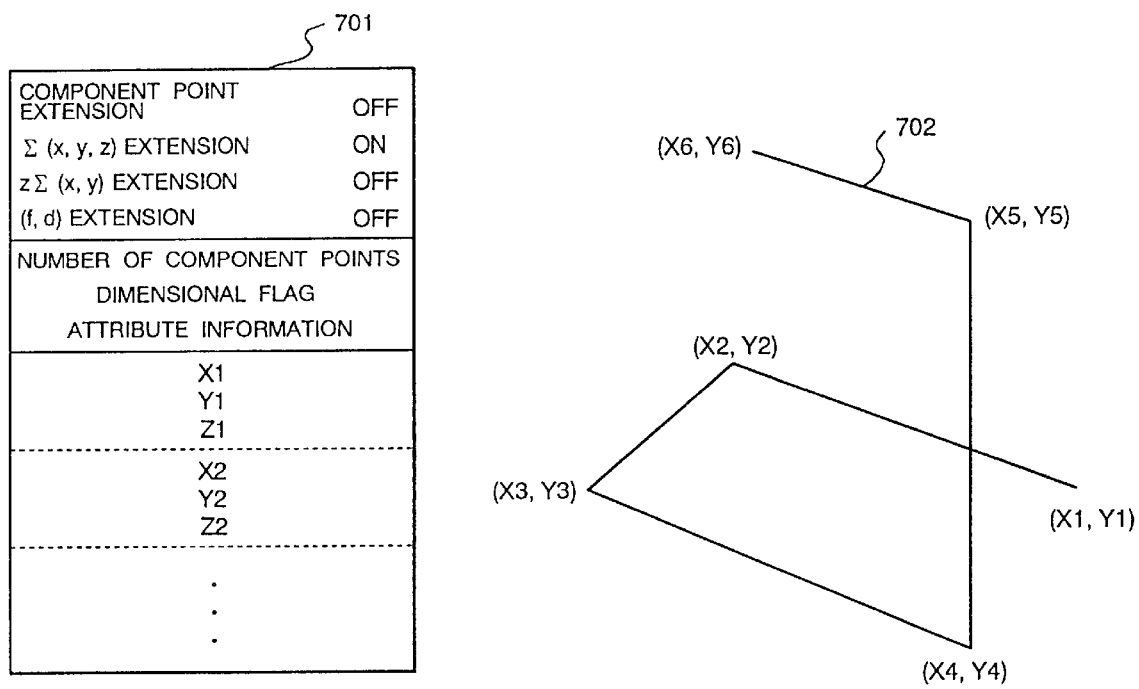
FIG. 7 is a diagrammatic view of a representation of a three-dimensional broken line.

Referring to FIG. 7, the Σ(x, y, z) extension flag included in graphic data on a three-dimensional broken line 702 extending in a three-dimensional space is in the ON state and hence the graphic data is expressed by a table 701. Component point information includes sets of coordinates (x, y, z).

Referring to FIG. 8, the zΣ(x, y) extension flag included in graphic data on a plane 802 at a given altitude from a reference plane is in the ON state and hence the graphic data is expressed by a table 801. Component point information includes sets of coordinates (x, y). A common z-coordinate for all the component points is included in the header information.

Figure 9:
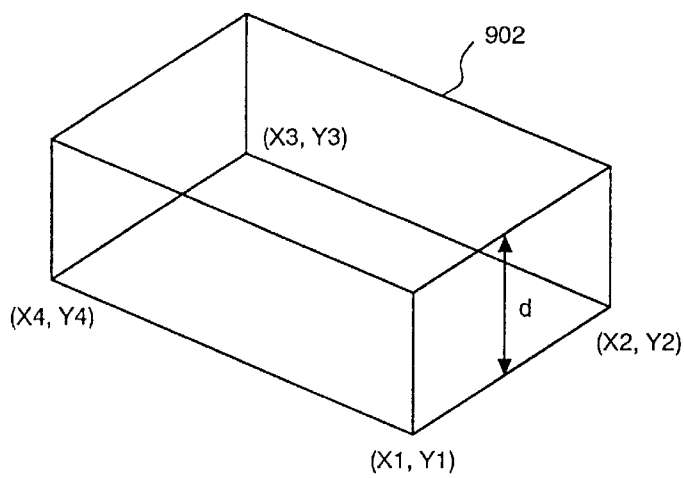
FIG. 9 is a diagrammatic view of a representation of a polyangular column.

Referring to FIG. 9, the (f, d) extension flag included in graphic data on a polyangular column 902 is in the ON state and the meaning information specifies a polyangular column and hence the graphic data is expressed by a table 901. The component point information expressed by sets of coordinates (x, y) and representing the shape of the bottom surface of the polygonal column and the parameter d specifying the height of the polyangular column are included in the header information.

Figure 10:
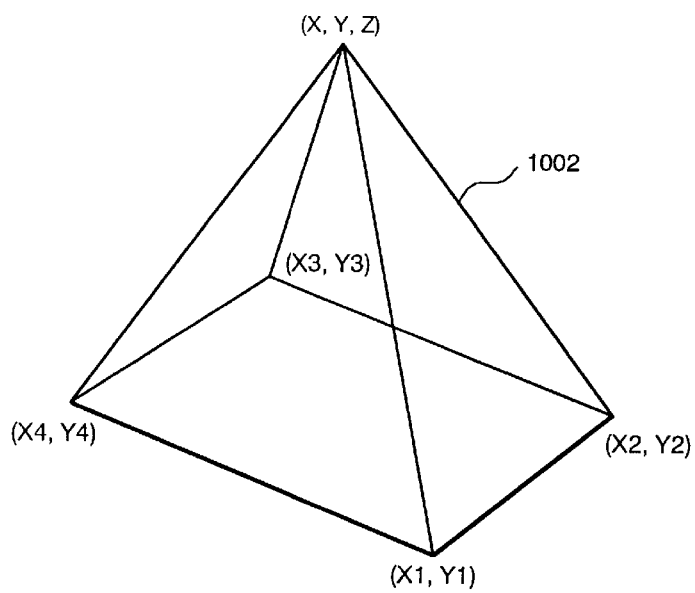
FIG. 10 is a diagrammatic view of a representation of a polyangular pyramid.

Referring to FIG. 10, the (f, d) extension flag included in graphic data on a polyangular pyramid 1002 is in the ON state and the meaning information f specifies a polyangular pyramid and hence the graphic data is expressed by a table 1001. The component point information represented by sets of coordinates (x, y) and representing the shape of the bottom surface of the polyangular pyramid and the parameter d specifying the coordinates (x, y, z) of the vertex of the polyangular pyramid are included in the header information. The vertex may be specified by a plurality of parameters d specifying, in this case, the x-, y- and z-coordinate of the vertex. The number of parameters d is determined by the meaning information f.

Figure 11:
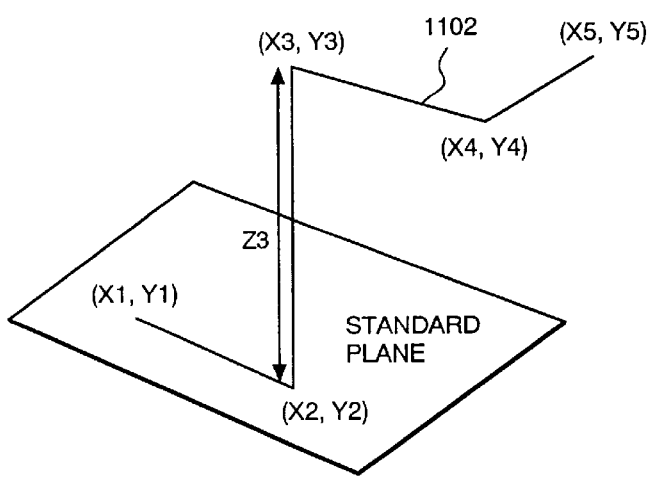
FIG. 11 is a diagrammatic view of a representation of a three-dimensional broken line.

Referring to FIG. 11, a three-dimensional broken line 1102 extending in a three-dimensional space, similarly to the three-dimensional broken line of FIG. 7, can be expressed through Σ(x, y, z) extension. If the z-coordinates of a series of component points succeeding the component point specified by the set of coordinates (x, y, z) are equal to the z-coordinate of the component point specified by the set of coordinates (x, y, z), the Σ(x, y, z) extension is executed for only one of the component points to reduce the amount of data. The graphic data is expressed by a table 1101. In the header information shown in FIG. 4, the component point extension flag 401 is set to the ON state and flag information 411 and 412 is added to each component point. The Σ(x, y, z) extension flag 411 for a component point to be subjected to the Σ(x, y, z) extension is set to the ON state to add a z-coordinate and the Σ(x, y, z) extension flags 411 for the rest of the component points are set to the OFF state. Consequently, the component point for which the Σ(x, y, z) extension flag is set to the ON state is managed by using coordinates (x, y, z) and the component points for which the Σ(x, y, z) extension flags 411 are set to the OFF state are managed by using coordinates (x, y). More concretely, in the table 1101 shown in FIG. 11, since a first and a second component point specified by the data succeeding the header information are included in a reference plane, the Σ(x, y, z) flags 411 for those component points are set to the OFF state and the those component points are specified by sets of coordinates (x, y). The Σ(x, y, z) extension flag 411 for a third component point is set to the ON state and the third component point is specified by a set of coordinates (X3, Y3, Z3), and the Σ(x, y, z) extension flags 411 for a fourth and a fifth component point are set to the OFF state. The z-coordinates of the component points following the third component point are equal to the z-coordinate of the third component point.

Figure 12:
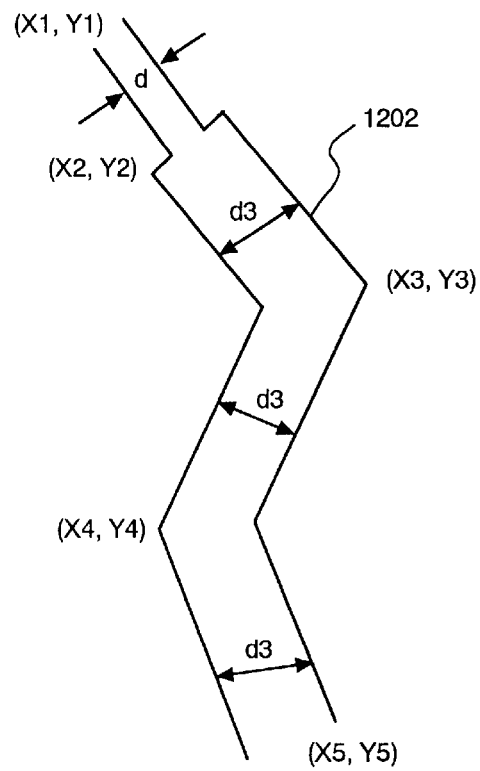
FIG. 12 is a diagrammatic view of a representation of a broken line having a width.

FIG. 12 shows a broken line 1202 consisting of segments respectively having different widths. Although a broken line having a fixed width can be expressed by a band, i.e., a broken line having a width d by subjecting the entire figure to the (f, d) extension and specifying a band by the meaning information, component points defining segments having different widths are subjected further to the (f, d) extension to express the broken line consisting of the segments of different widths as shown in FIG. 12. In the header information shown in FIG. 4, the component point extension flag 401 is in the ON state and flag information 411 and 412 is added to each component point. The (f, d) extension flag 412 for a component point to be subjected to the (f, d) extension is set to the ON state to add the meaning information f 416 and the parameter d 417, and the (f, d) extension flags 412 for the rest of the component points are set to the OFF state. The figure 1202 can be expressed by interpreting this structure on the basis of a definition: "the widths of the segments following the segment having a specified width are equal to the width of the segment having the specified width". More concretely, in the table 1201 shown in FIG. 12, the (f, d) extension flag included in the header information is set to the ON state, a band is specified by the meaning information f and a width is specified by the parameter d to set a reference (f, d) extension. Since a first and a second component point succeeding the header information are subjected to the reference (f, d) extension, the (f, d) extension flags for those component points are set to the OFF state. Since a segment extending from the second component point to a third component point has a width d3, the (f, d) extension flag for the third component point is set to the ON state, a band is specified by the meaning information f and the width d3 is specified by the parameter d. Consequently, the widths of the segments extending after the third component point are d3.

Figure 13:
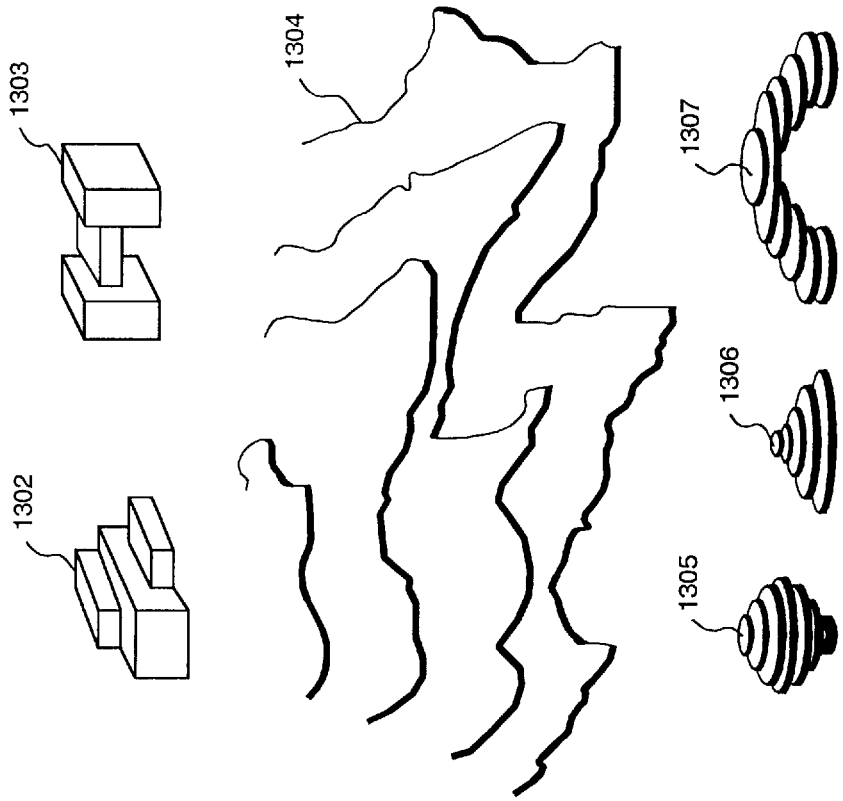
FIG. 13 is a diagrammatic view of a representation of a three-dimensional figure having a complex shape.

Referring to FIG. 13, ground structures 1302 to 1307 each having a complex shape can be formed by subjecting the polyangular column shown in FIG. 9 to the $z\Sigma(x, y)$ extension and the (f, d) extension. The respective z-coordinates of the bottom surface and the top surface of the polyangular column are known from an altitude Z and the height d of the polyangular column included in the header information. A variety of three-dimensional figures having complex shapes, such as the houses 1302 and 1303, the contour lines 1304, the sphere 1305 like a gas tank, the pyramidal structure 1306 and the arch 1307 having the shape of an optional curved surface, can be expressed by combining a plurality of polyangular columns, because each of those three-dimensional figures can be expressed by a combination of polyangular columns. When expressing an arcuate figure of an optional shape, an object three-dimensional structure is sliced across the direction of the Z-axis at equal intervals into divisions, the respective sectional shapes of the divisions are determined, a plurality of polyangular columns having bottom surfaces of shapes corresponding to the sectional shapes of the divisions and heights corresponding to the equal slicing intervals are formed, and those polyangular columns are assembled to express the original figure.

Figure 14:
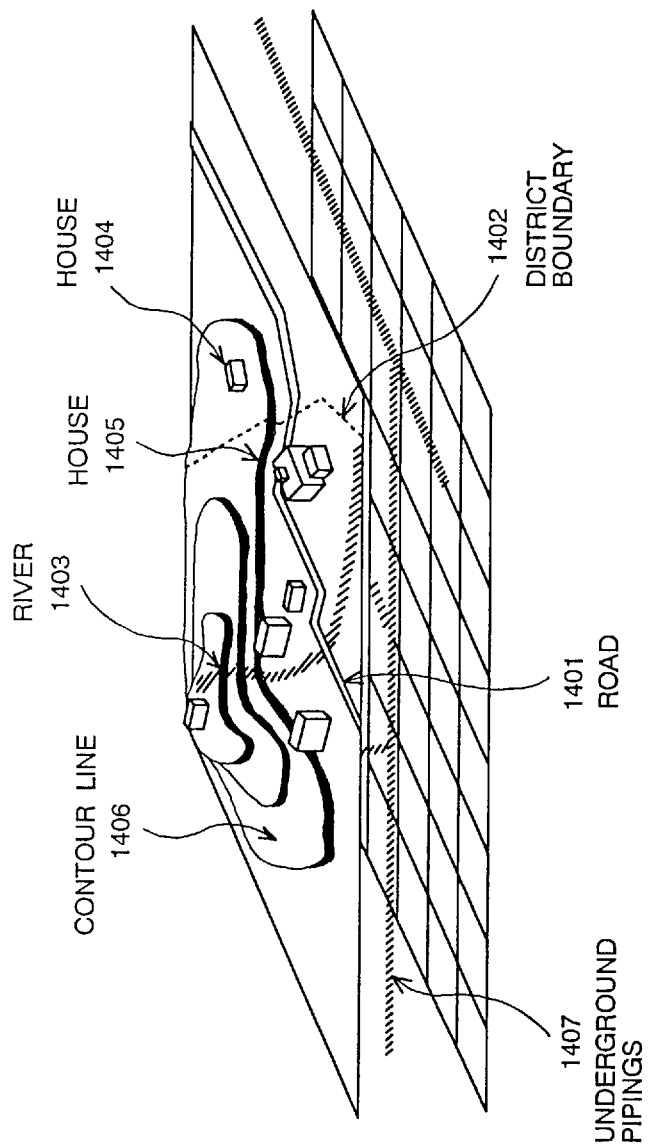
FIG. 14 is a diagrammatic view of a representation of a three-dimensional map including a plurality of three-dimensional figures of different shapes.
Figure 15:
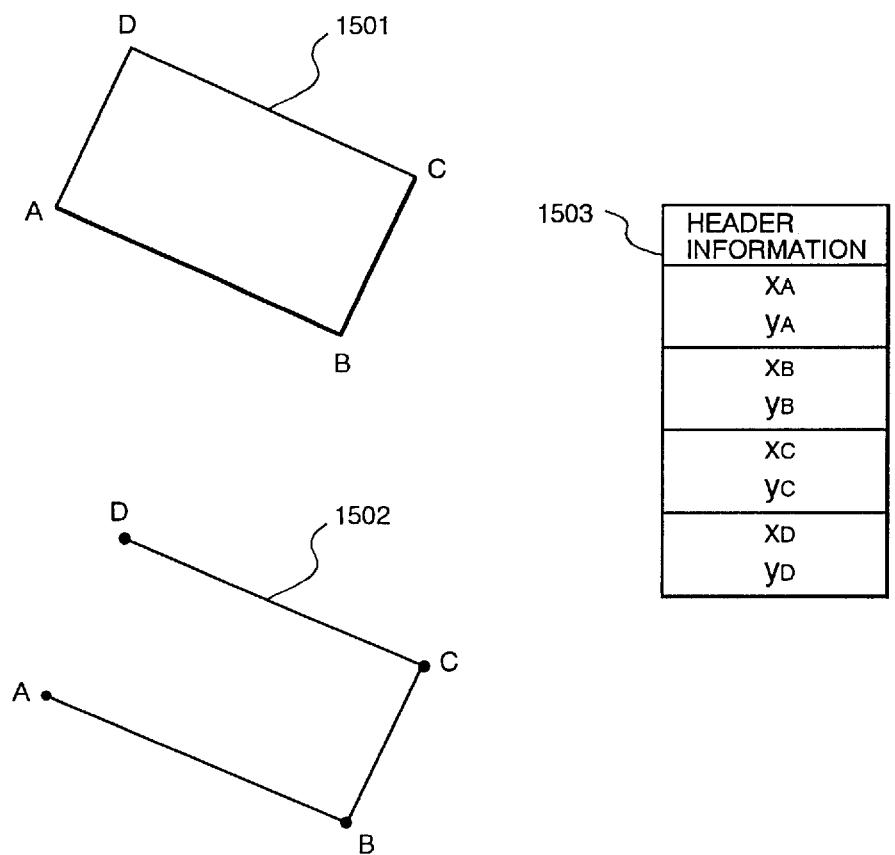
FIG. 15 is a pictorial view of assistance in explaining a conventional two-dimensional graphic data managing method.
Figure 16:
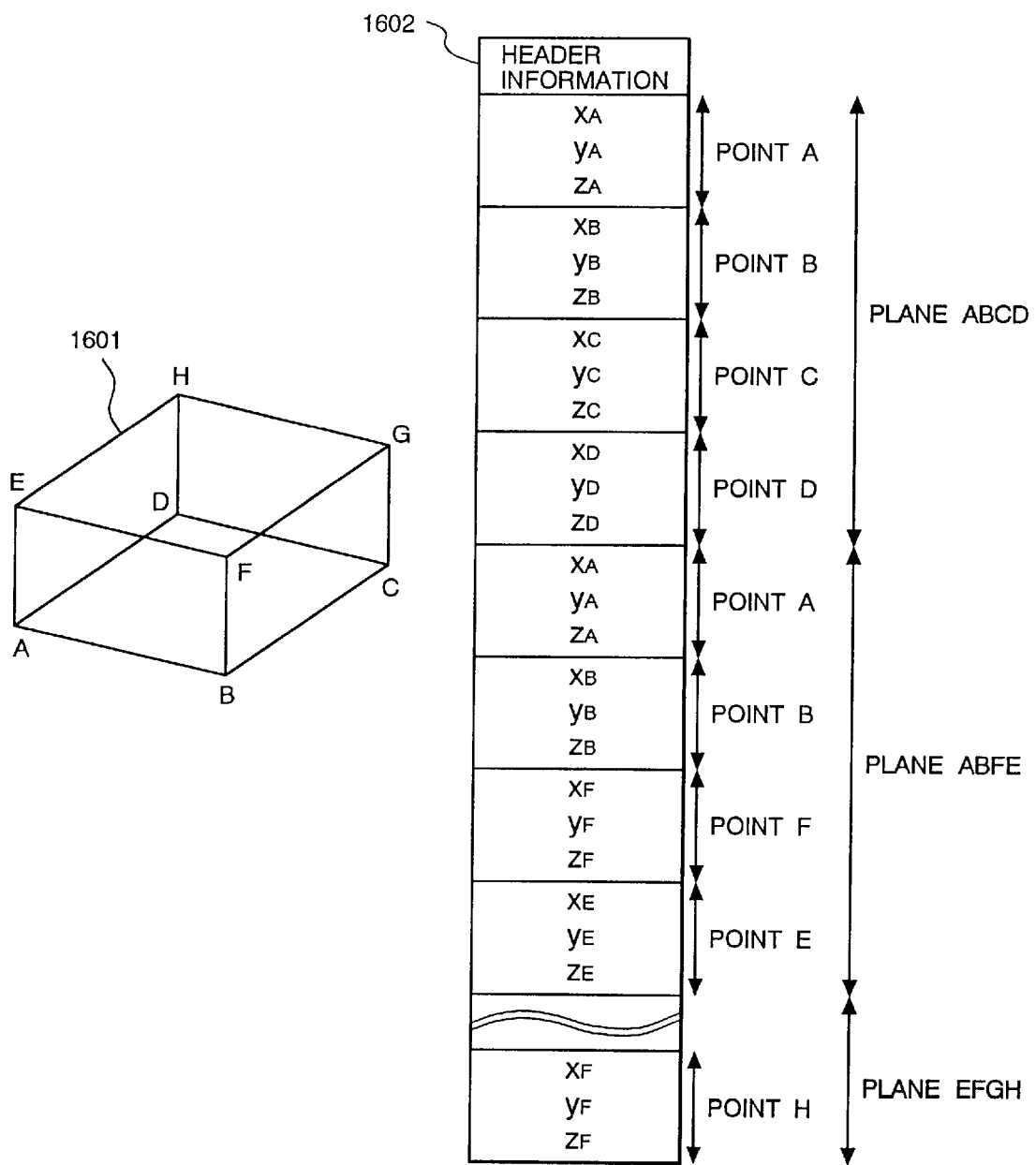
FIG. 16 is a diagrammatic view of assistance in explaining a conventional three-dimensional graphic data managing method.
Figure 17:
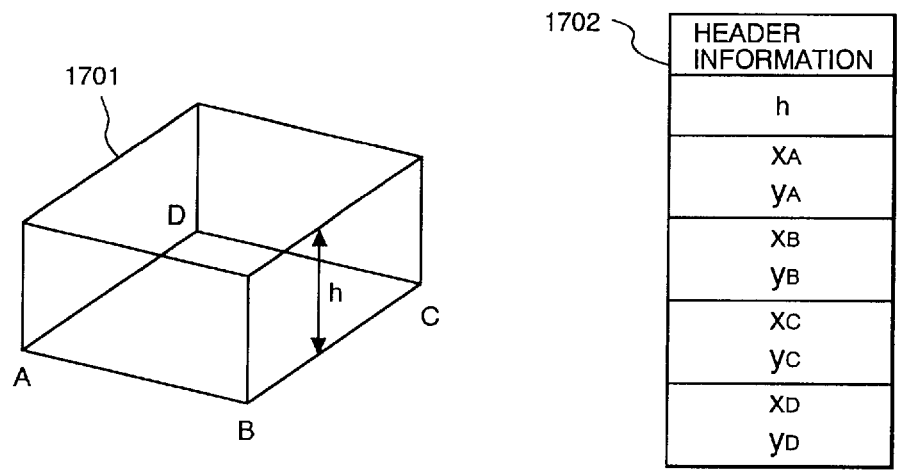
FIG. 17 is diagrammatic view of assistance in explaining another conventional three-dimensional graphic data managing method.

FIG. 14 shows an example of a three-dimensional figure including a road 1401, a district boundary 1402, a river 1403, houses 1404 and 1405, contour lines 1406 and underground piping 1407 formed by the three-dimensional graphic data managing system that carries out the three-dimensional graphic data managing method in accordance with the present invention. The three-dimensional graphic data managing system needs a comparatively small amount of graphic data to express the three-dimensional figure shown in FIG. 14.

As is apparent from the foregoing description, according to the present invention, details of figures can be expressed by using a comparatively small amount of graphic data, two-dimensional figures can be easily formed as well as three-dimensional figures, and three-dimensional graphic information about undulations of mountains expressed by contour lines, houses and urban structures including underground piping can be handled using a comparatively small amount of graphic data.

Although the invention has been described in its preferred embodiments, obviously, modifications and alterations will occur to those with ordinary skill in the art upon reading and understanding the present invention. It is intended that the invention be construed as including all such modifications and alterations is so far they come with the scope of the appended claims or the equivalent thereof.

We claim:

1. A three-dimensional graphic data managing method for managing three-dimensional graphic data expressed by the coordinates of the component points of figures, comprising the steps of:

forming a piece of data representing a three-dimensional figure of header information and component point information;

storing a height common to the entire three-dimensional figure, and attribute information including the shape and the color of the three-dimensional figure in the header information;

storing attribute information including coordinates specifying the positions of the component points of the three-dimensional figure in the component point information;

and providing the header information or the component point information with a control flag for indicating the deletion of pieces of attribute information unnecessary for expressing graphic shapes or the addition of pieces of attribute information necessary for expressing graphic shapes.

2. A three-dimensional graphic data managing method for managing three-dimensional graphic data expressed by the coordinates of the component points of figures, comprising the steps of:

forming a piece of data representing a three-dimensional figure of header information and component point information;

storing a height common to the entire three-dimensional figure, and attribute information including the shape and the color of the three-dimensional figure in the header information;

storing sets of coordinates (x, y) specifying the positions of the component points of the three-dimensional figure in the component point information;

providing the header information with a control flag; and controlling whether or not an area for storing extension information about predetermined operations for extension to be carried out for all the component points is to be added to the header information or the component point information.

3. A three-dimensional graphic data managing method according to claim 2, wherein the control flag is a $\Sigma(x, y, z)$ extension flag for specifying the use of coordinates (x, y, z) instead of coordinates (x, y) to specify the positions of all the component points of the three-dimensional figure, and an area for storing a z-coordinate in addition to coordinates (x, y) is added to all pieces of the component point information and the positions of the component points are specified by the coordinates (x, y, z) when the $\Sigma(x, y, z)$ extension flag is in the ON state.

4. A three-dimensional graphic data managing method according to claim 2, wherein the control flag is a $z\Sigma(x, y,)$ extension flag for specifying the altitude of the three-dimensional figure, and an area for storing a z-coordinate indicating the altitude is added to the header information when the $z\Sigma(x, y)$ extension flag is in the ON state.

5. A three-dimensional graphic data managing method according to claim 2, wherein the control flag is a (f, d) extension flag for specifying information about the construction of the three-dimensional figure and information associated with the construction, and an area for storing meaning information f representing the construction of the three-dimensional figure and a parameter d representing the information associated with the construction is added to the header information when the (f, d) extension flag is in the ON state.

6. A three-dimensional graphic data managing method according to claim 2, wherein each piece of component point information is provided with an extension flag, and an area for storing extension information about a predetermined extension to be carried out for the stored component points is added to the component point information when the extension flag is in the ON state.

7. A three-dimensional graphic data managing method according to claim 2, wherein each piece of component point information is provided with a$\Sigma(x, y, z)$ extension flag, and an area for storing a z-coordinate in addition to the coordinates (x, y) is added to the component point information about the component point when the $\Sigma(x, y, z)$ extension flag is in the ON state to specify the position of the component point by the coordinates (x, y, z), and the z-coordinates of the component points following the component point specified by the $\Sigma(x, y, z)$ extension flag in the ON state and specified by the $\Sigma(x, y, z)$ extension flags in the OFF state are equal to the z-coordinate of the component point specified by the $\Sigma(x, y, z)$ extension flag in the ON state.

8. A three-dimensional graphic data managing method according to claim 2, wherein each piece of the component point information is provided with a (f, d) extension flag connected with the component point, an area for storing meaning information f and a parameter d is added to the piece of the component point information about the component point when the (f, d) extension flag is in the ON state to subject the component point to extension using the meaning information f and the parameter d, and the component points following the component point specified by the (f, d) extension flag in the ON state and specified by the (f, d) extension flags in the OFF state are subjected to the same extension.

9. A three-dimensional graphic data managing method according to claim 2, wherein the control flag is a $\Sigma(x, y, z)$ extension flag for specifying the use of coordinates (x, y, z) instead of coordinates (x, y) to specify the positions of all the component points of the three-dimensional figure or a $z\Sigma(x, y)$ flag for specifying the specification of the altitude of the three-dimensional figure or a (f, d) extension flag for specifying the construction of the three-dimensional figure and information associated with the construction, the three-dimensional figure is managed by using the $\Sigma(x, y, z)$ extension flag, the $z\Sigma(x, y)$ extension flag and the (f, d) extension flag individually or in combination, and the $\Sigma(x, y, z)$ extension flag, the $z\Sigma(x, y)$ extension flag and the (f, d) extension flag are stored in different storage positions, respectively.

* * * * *